US012658561B2

(12) United States Patent
Sadhu et al.

(10) Patent No.: US 12,658,561 B2
(45) Date of Patent: Jun. 16, 2026

(54) SYMMETRIC MULTI-IC MODULES USING HIERARCHICAL DIGITAL RECONFIGURATION OF INTEGRATED CIRCUIT CHIPS

(71) Applicant: INTERNATIONAL BUSINESS MACHINES CORPORATION, Armonk, NY (US)

(72) Inventors: Bodhisatwa Sadhu, Peekskill, NY (US); Mark Yeck, Bloomingdale, NJ (US); Arun Paidimarri, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 470 days.

(21) Appl. No.: 17/741,677

(22) Filed: May 11, 2022

(65) Prior Publication Data

US 2023/0369743 A1 Nov. 16, 2023

(51) Int. Cl.
| | |
|---|---|
| *H01Q 1/22* | (2006.01) |
| *H01Q 1/40* | (2006.01) |
| *H01Q 13/10* | (2006.01) |
| *H10W 44/20* | (2026.01) |

(52) U.S. Cl.
CPC ............. *H01Q 1/2283* (2013.01); *H01Q 1/40* (2013.01); *H01Q 13/10* (2013.01); *H10W 44/20* (2026.01)

(58) Field of Classification Search
USPC .......................................................... 716/119
See application file for complete search history.

(56) References Cited

U.S. PATENT DOCUMENTS

| | | | |
|---|---|---|---|
| 8,816,929 | B2 | 8/2014 | Kam |
| 9,537,224 | B2 | 1/2017 | Friedman |
| 9,595,767 | B2 | 3/2017 | Choudhury |
| 9,985,346 | B2 | 5/2018 | Baks |
| 11,018,747 | B2 | 5/2021 | Friedman |
| 11,108,170 | B2 | 8/2021 | Chakraborty |
| 2013/0314968 | A1* | 11/2013 | Shaeffer ................... G11C 5/02 257/777 |
| 2016/0181703 | A1 | 6/2016 | Choudhury |
| 2020/0144733 | A1 | 5/2020 | Chakraborty |

OTHER PUBLICATIONS

"Renesas Expands 5G mmWave Beamformer Portfolio with Industry-Leading Transmitter Output Power Capability", Renesas Electronics Corporation, 3 pps., (Nov. 10, 2021), Retrieved from <https://www.renesas.com/us/en/about/press-room/renesas-expands-5g-mmwave-beamformer-portfolio-industry-leading-transmitter-output-power-capability>.
Baniya et al., "Switched-Beam 60-GHz Four-Element Array for Multichip Multicore System", 2017, IEEE Transactions on Components, Packaging and Manufacturing Technology, 8(2), 251-260.

(Continued)

*Primary Examiner* — Bryce M Aisaka

(74) *Attorney, Agent, or Firm* — Scott Dobson

(57) ABSTRACT

A circuit comprises a set of ports of a first type arranged symmetrically about an axis of symmetry of the circuit, and a digital reassigner configured to reassign an original port of the set of ports to a reassigned port of the set of ports located on an opposite side of the axis of symmetry.

20 Claims, 17 Drawing Sheets

(56)  References Cited

OTHER PUBLICATIONS

Gu et al., "Development, Implementation, and Characterization of a 64-Element Dual-Polarized Phased-Array Antenna Module for 28-GHz High-Speed Data Communications," in IEEE Transactions on Microwave Theory and Techniques, vol. 67, No. 7, pp. 2975-2984, Jul. 2019, doi: 10.1109/TMTT.2019.2912819, <https://ieeexplore.ieee.org/abstract/document/8718254>.

Gu et al., "Packaging and Antenna Integration for Silicon-Based Millimeter-Wave Phased Arrays: 5G and Beyond", IEEE Journal of Microwaves, Date of current version Jan. 7, 2021, 1(1), 123-134.

Gu et al., "W-band scalable phased arrays for imaging and communications," in IEEE Communications Magazine, vol. 53, No. 4, pp. 196-204, Apr. 2015, doi: 10.1109/MCOM.2015.7081095, <https://ieeexplore.ieee.org/document/8436439>.

Gu et al., "A compact 4-chip package with 64 embedded dual-polarization antennas for W-band phased-array transceivers," 2014 IEEE 64th Electronic Components and Technology Conference (ECTC), 2014, pp. 1272-1277, doi: 10.1109/ECTC.2014.6897455.

Lee et al., "Fully Integrated 94-GHZ Dual-Polarized TX and RX Phased Array Chipset in SiGe BiCMOS Operating up to 105° C.", in IEEE Journal of Solid-State Circuits, vol. 53, No. 9, pp. 2512-2531, Sep. 2018, doi: 10.1109/JSSC.2018.2856254, <https://ieeexplore.ieee.org/document/8436439>.

Plouchart et al., "Si-Based 94-GHz Phased Array Transmit and Receive Modules for Real-Time 3D Radar Imaging," 2019 IEEE MTT-S International Microwave Symposium (IMS), 2019, pp. 532-535, doi: 10.1109/MWSYM.2019.8701092.

Sadhu et al., "A 28-GHz 32-Element TRX Phased-Array IC With Concurrent Dual-Polarized Operation and Orthogonal Phase and Gain Control for 5G Communications," in IEEE Journal of Solid-State Circuits, vol. 52, No. 12, pp. 3373-3391, Dec. 2017, doi: 10.1109/JSSC.2017.2766211, <https://ieeexplore.ieee.org/abstract/document/8110833>.

Sadhu et al., "The More (Antennas), the Merrier: A Survey of Silicon-Based mm-Wave Phased Arrays Using Multi-IC Scaling," in IEEE Microwave Magazine, vol. 20, No. 12, pp. 32-50, Dec. 2019, doi: 10.1109/MMM.2019.2941632, <https://ieeexplore.ieee.org/abstract/document/8894633>.

Tran, "Developing a Symmetrical Phased Array Antenna with Low Complexity", Oct. 2017, 2017 7th international conference on Integrated Circuit, Design, and Verification (ICDV), 6 pps.

Valdes-Garcia et al., "Circuit and antenna-in-package innovations for scaled mmWave 5G phased array modules", 2018 IEEE Custom Integrated Circuits Conference (CICC), 2018, pp. 1-8, doi: 10.1109/CICC.2018.8357050, <https://ieeexplore.ieee.org/abstract/document/8357050>.

Valdes-Garcia et al., "Scaling Millimeter-Wave Phased Arrays: Challenges and Solutions", 2018 IEEE BiCMOS and Compound Semiconductor Integrated Circuits and Technology Symposium (BCICTS), 2018, pp. 80-84, doi: 10.1109/BCICTS.2018.8551062, <https://ieeexplore.ieee.org/abstract/document/8551062>.

* cited by examiner

1200

1205 — DESIGN ICs WITH SYMMETRICAL PORTS

1210 — PROVIDE A DIGITAL REASSIGNER TO REASSIGN THE PORTS

1215 — USING ROTATION (IF REQUIRED) AND DIGITAL PORT REASSIGNMENTS, OBTAIN FOUR SYMMETRICAL IC PERSONALITIES

1220 — PLACE ICs IN PACKAGE SYMMETRICALLY

1225 — DIGITALLY REASSIGN IC PORTS LOCATED IN THE X AND Y MIRROR LOCATIONS OF THE PACKAGE

SYMMETRIC MULTI-IC MODULES USING HIERARCHICAL DIGITAL RECONFIGURATION OF INTEGRATED CIRCUIT CHIPS

BACKGROUND

Disclosed herein is a system and related method for dynamically producing symmetric multi circuit modules using hierarchical digital reconfiguration of circuits.

SUMMARY

Disclosed herein is a circuit, which may be an integrated circuit (IC) that comprises a set of ports of a first type arranged symmetrically about an axis of symmetry of the IC, and a digital reassigner configured to reassign an original port of the set of ports to a reassigned port of the set of ports located on an opposite side of the axis of symmetry.

Disclosed herein is also an IC module, comprises a plurality of the ICs in which a first modified proper subset of the plurality of the ICs are modified ICs that have digitally reassigned ports such that the modified ICs are mirrored personalities of an unmodified subset of the plurality of the ICs.

Disclosed herein is also a method for producing a circuit, comprising creating an integrated circuit, comprising a plurality of ports of a first type arranged about an axis of symmetry, and a digital reassigner configured to reassign an original port of the set of ports to a reassigned port of the set of ports located on an opposite side of the axis of symmetry.

Furthermore, embodiments may take the form of a related computer program product, accessible from a computer-usable or computer-readable medium providing program code for use, by, or in connection, with a computer or any instruction execution system. For the purpose of this description, a computer-usable or computer-readable medium may be any apparatus that may contain a mechanism for storing, communicating, propagating, or transporting the program for use, by, or in connection, with the instruction execution system, apparatus, or device.

BRIEF DESCRIPTION OF THE DRAWINGS

Various embodiments are described herein with reference to different subject-matter. In particular, some embodiments may be described with reference to methods, whereas other embodiments may be described with reference to apparatuses and systems. However, a person skilled in the art will gather from the above and the following description that, unless otherwise notified, in addition to any combination of features belonging to one type of subject-matter, also any combination between features relating to different subject-matter, in particular, between features of the methods, and features of the apparatuses and systems, are considered as to be disclosed within this document.

In the drawings, various features may be described in a related format with reference numbering such that the numbering reflects similar items (e.g., 100.1, 100.2 . . . ). For the sake of brevity, such items may be referenced collectively or in a representative manner by only the first part of that numbering (e.g., 100).

The aspects defined above, and further aspects disclosed herein, are apparent from the examples of one or more embodiments to be described hereinafter and are explained with reference to the examples of the one or more embodiments, but to which the invention is not limited. Various embodiments are described, by way of example only, and with reference to the following drawings.

Figures 1A, 1B:
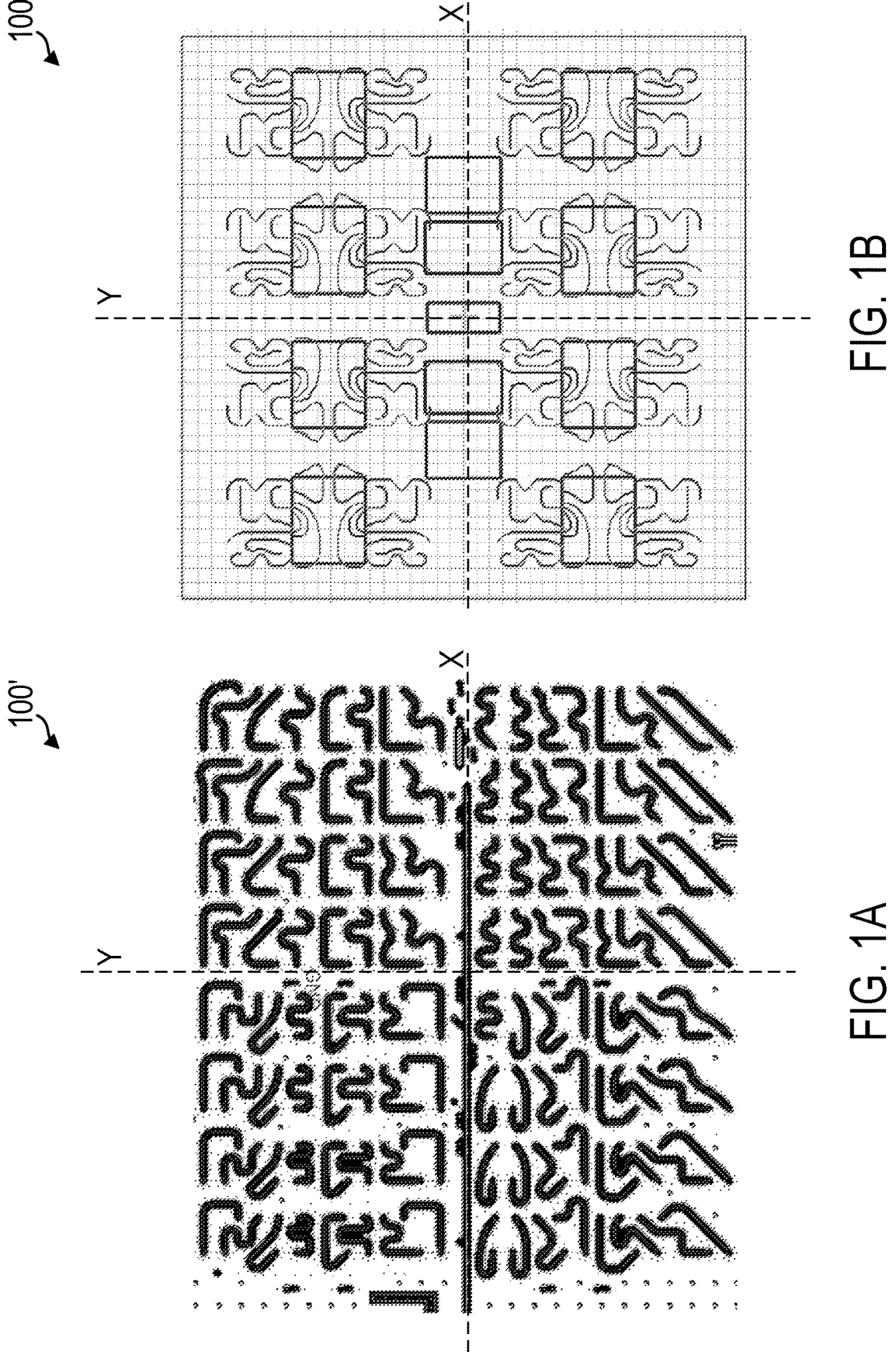

FIG. 1A is a pictorial diagram illustrating an example of the antenna connections on a module with asymmetric antenna routing.

FIG. 1B is a pictorial diagram illustrating an example of symmetric antenna routing, according to some embodiments.

Figures 2A, 2B, 2C:
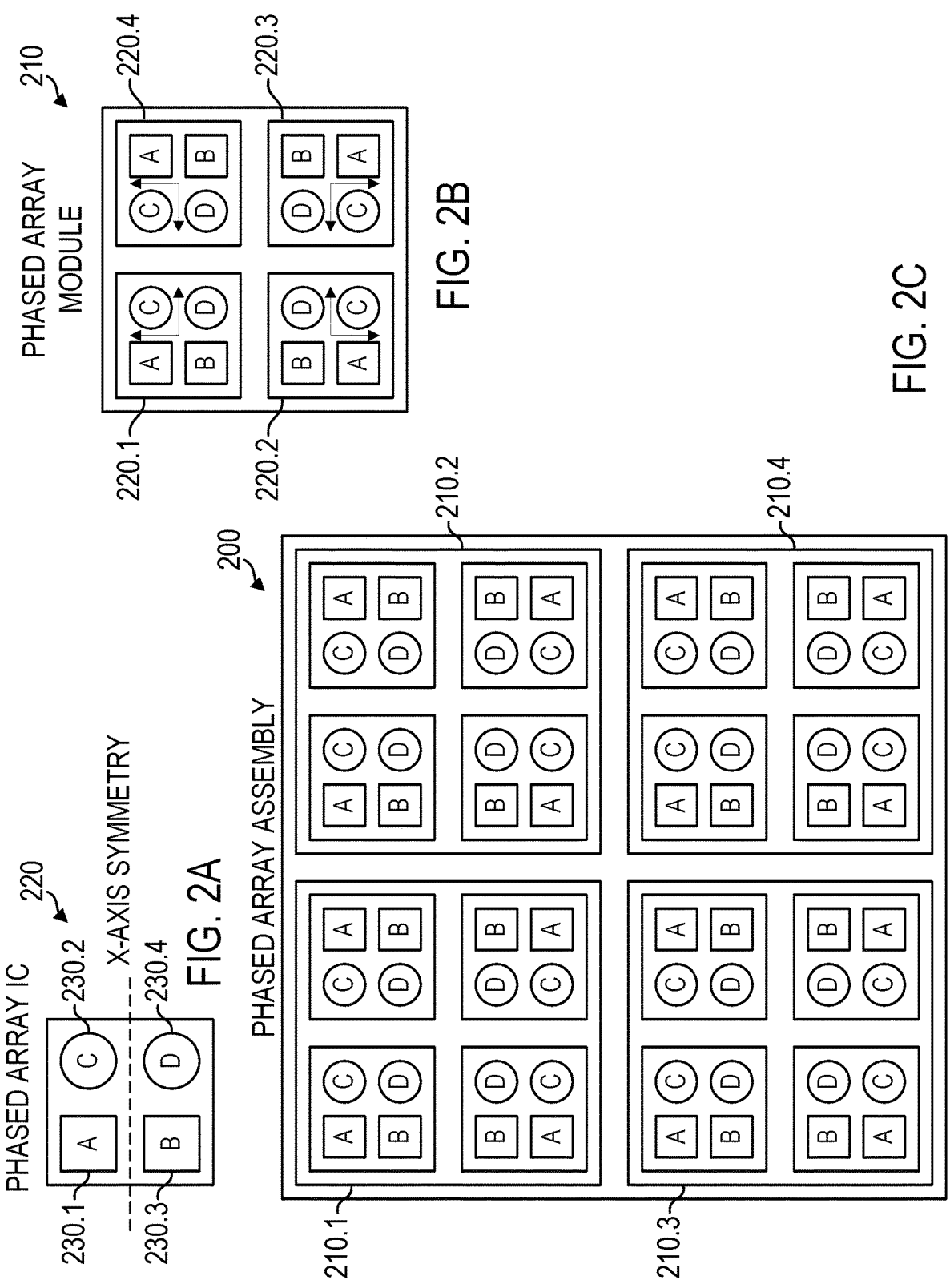

FIG. 2A is a pictorial diagram of a phased array IC having an X-axis symmetry, according to some embodiments.

FIG. 2B is a pictorial diagram of a phased array module, according to some embodiments.

FIG. 2C is a pictorial diagram of a phased array assembly, according to some embodiments.

Figure 3:
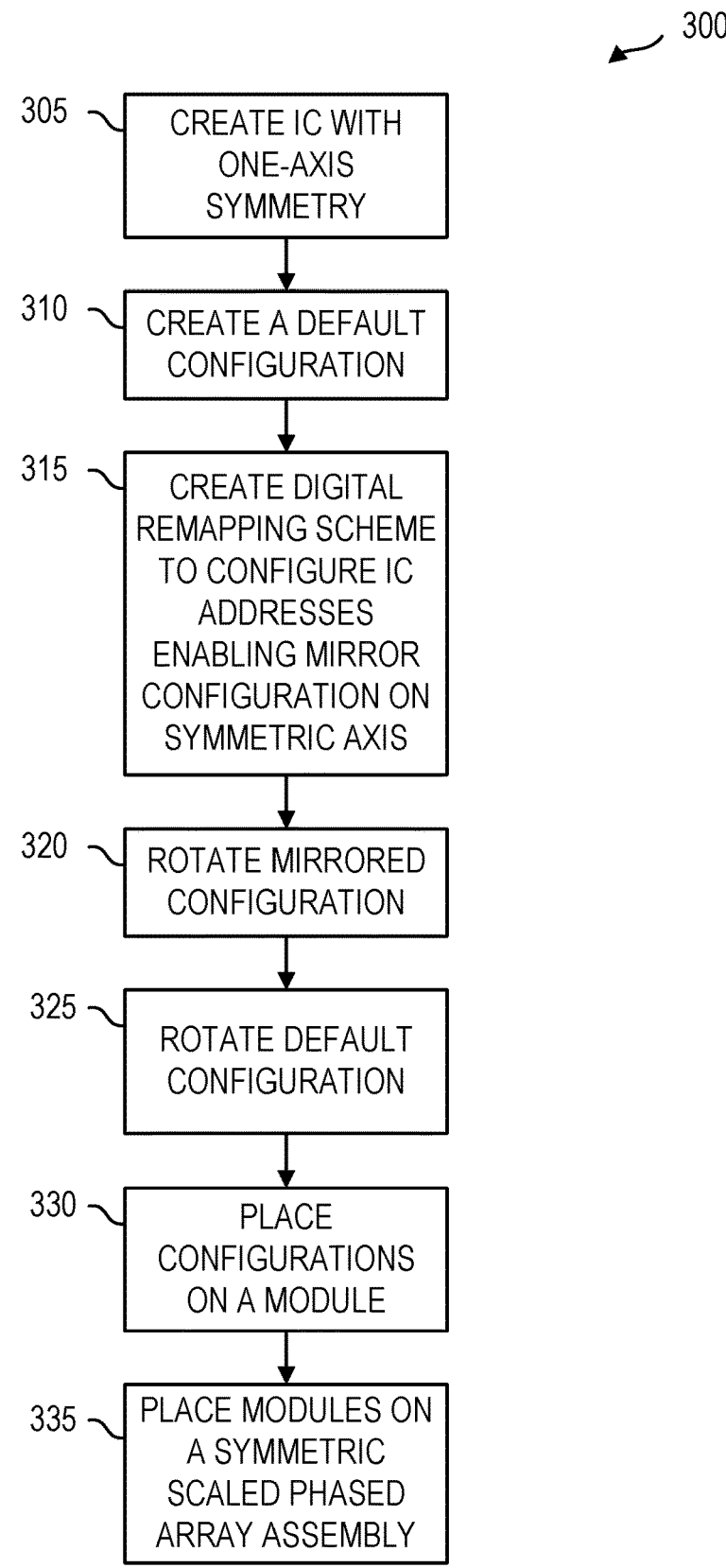

FIG. 3 is a flowchart of an example process that may be used to create the phased array assembly, according to some embodiments.

Figure 4:
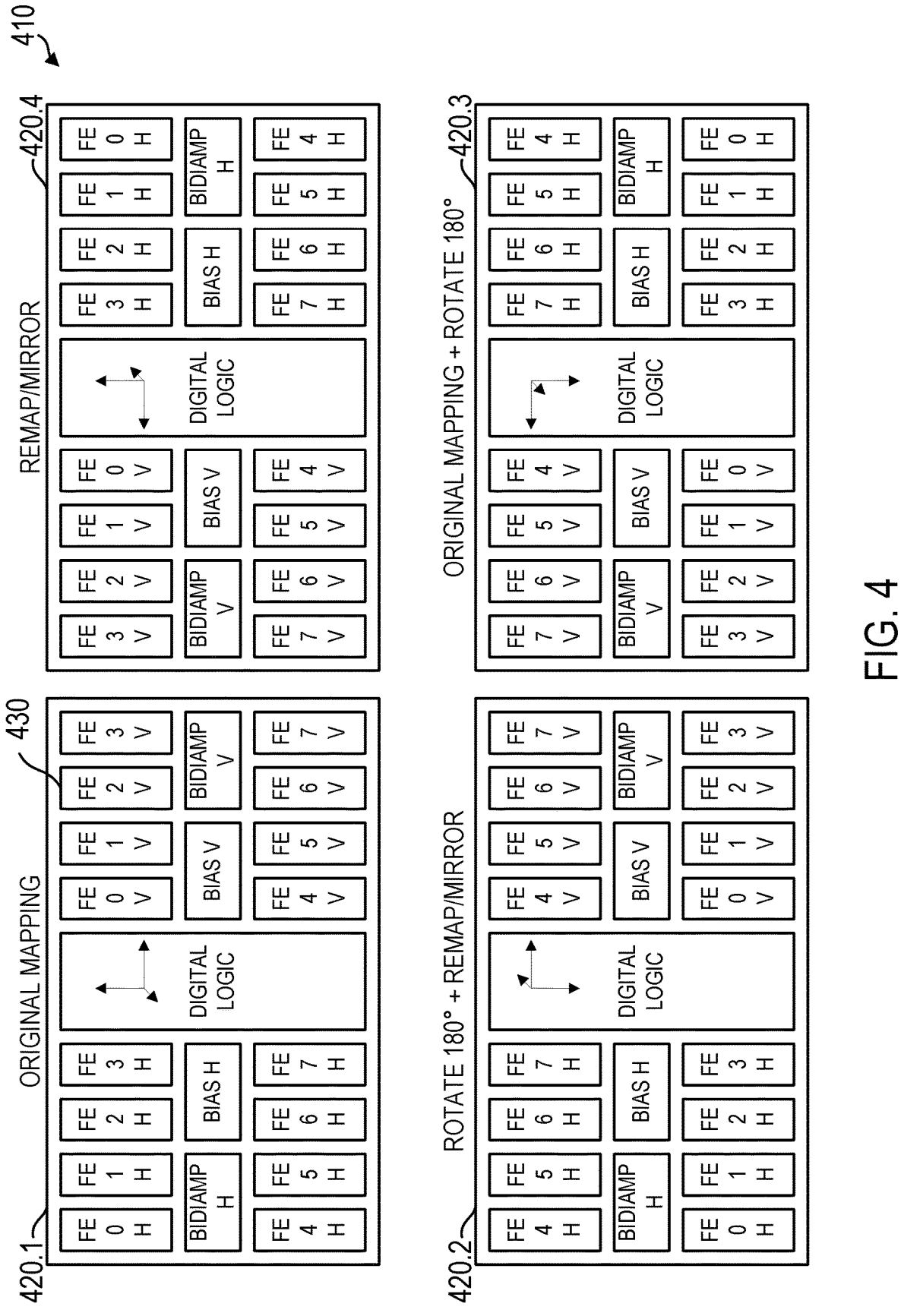

FIG. 4 is a pictorial diagram illustrating an example generalized embodiment of a multi-IC module, according to some embodiments.

Figure 5A:
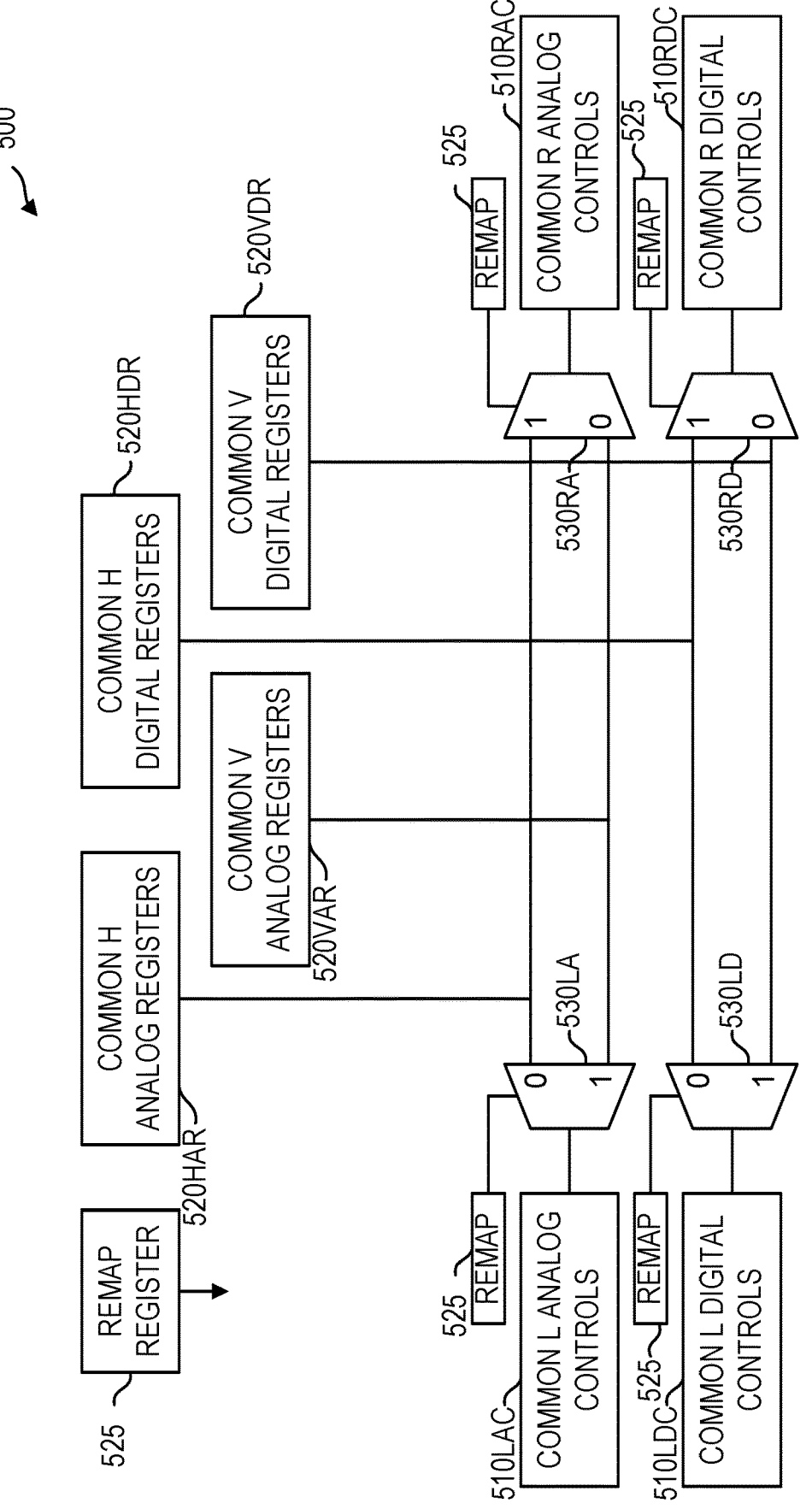
Figure 5B:
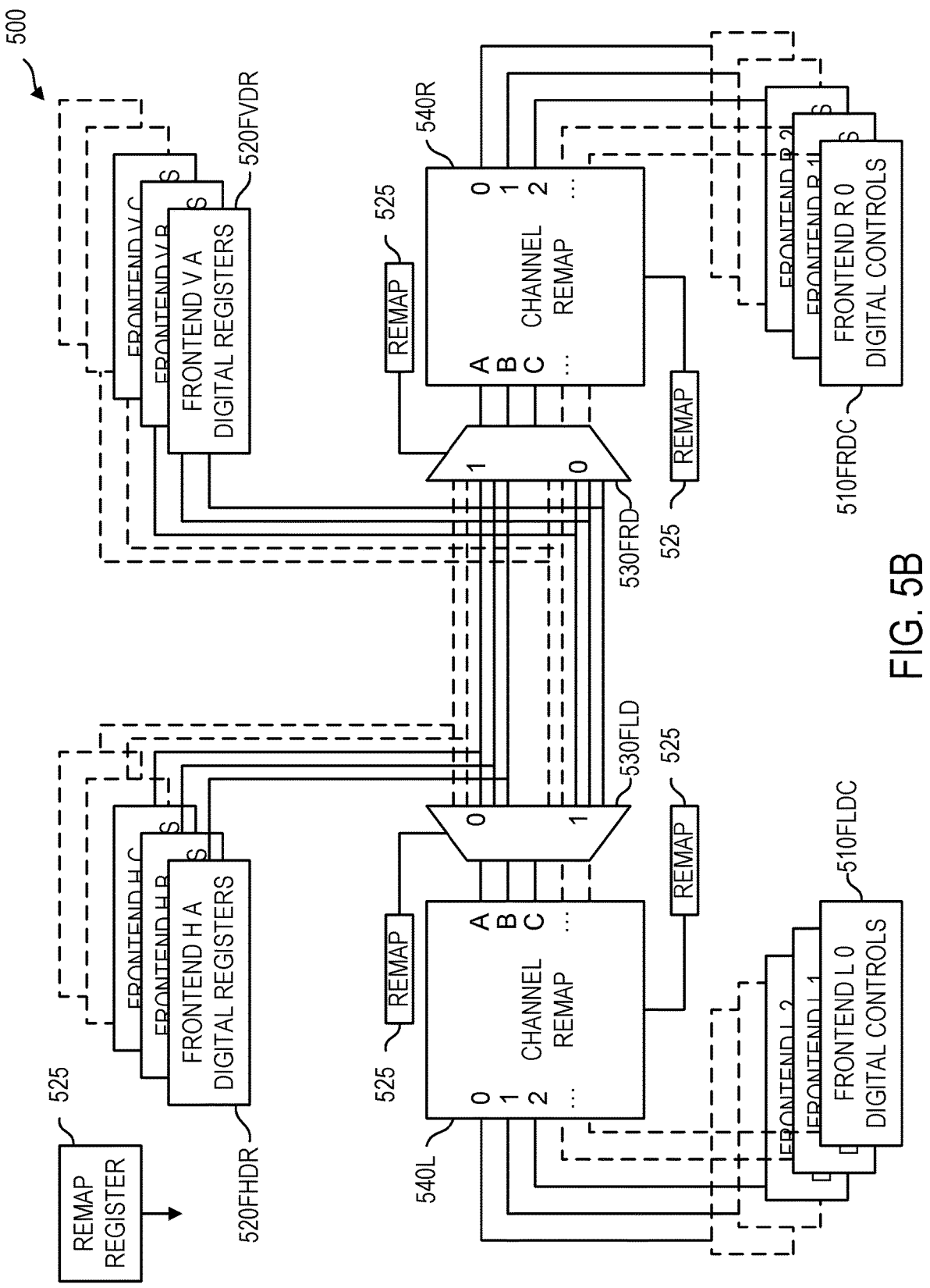

FIGS. 5A and 5B are parts of a schematic block diagram illustrating a generalized embodiment—the on-chip remapping implementation of a beamformer IC, according to some embodiments.

Figure 6:
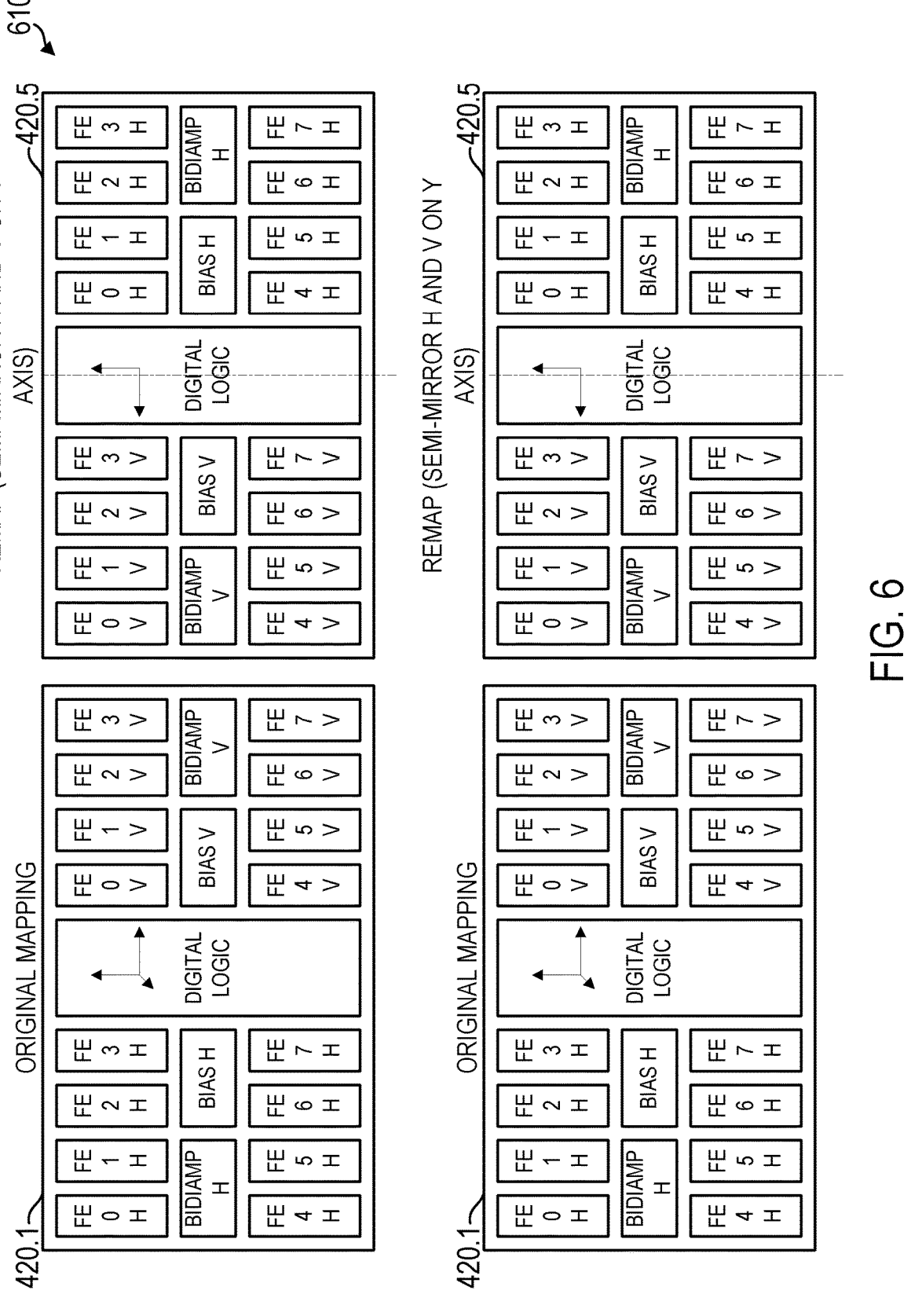

FIG. 6 is a pictorial block layout diagram of an example second main embodiment of a multi-IC module.

Figure 7A:
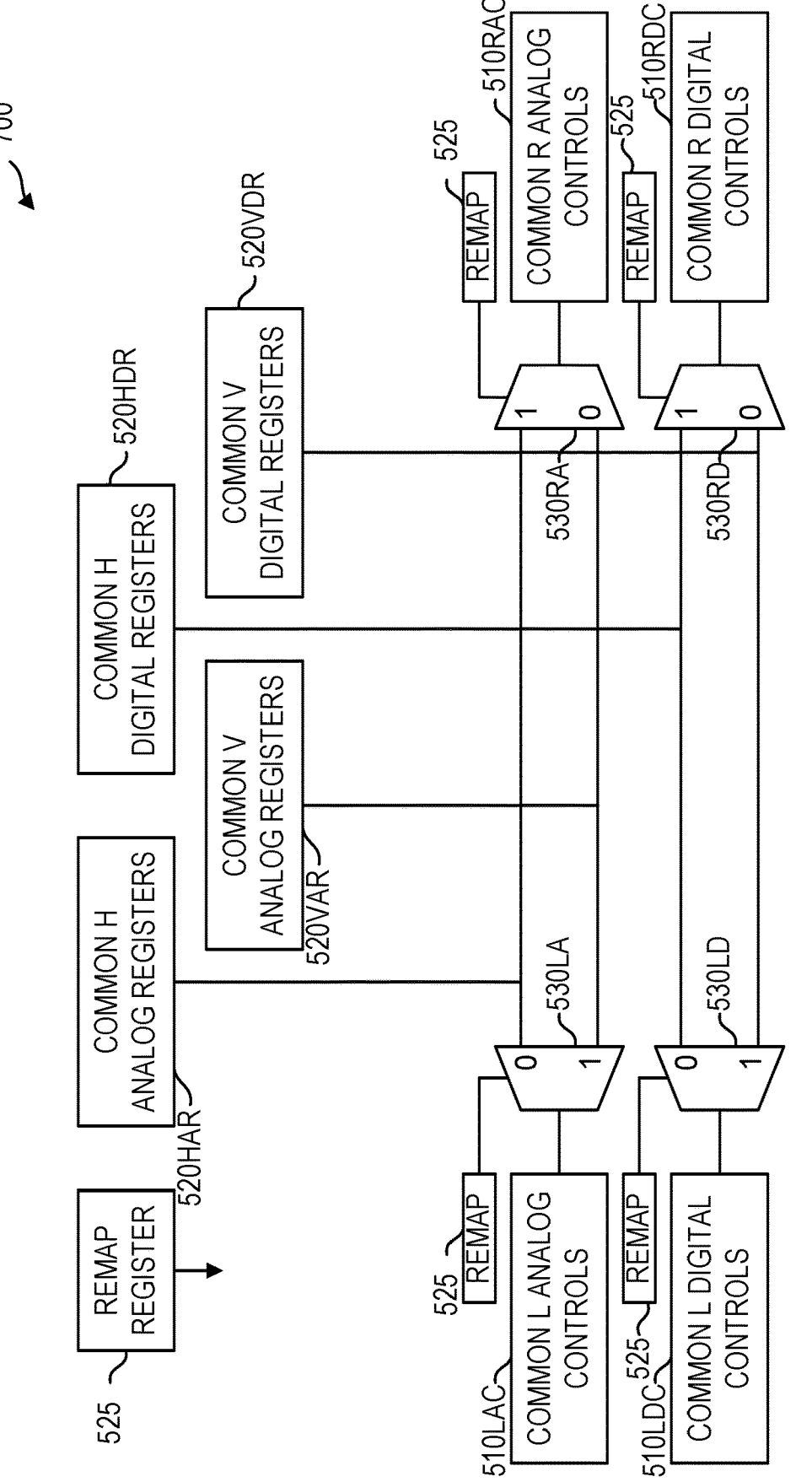
Figure 7B:
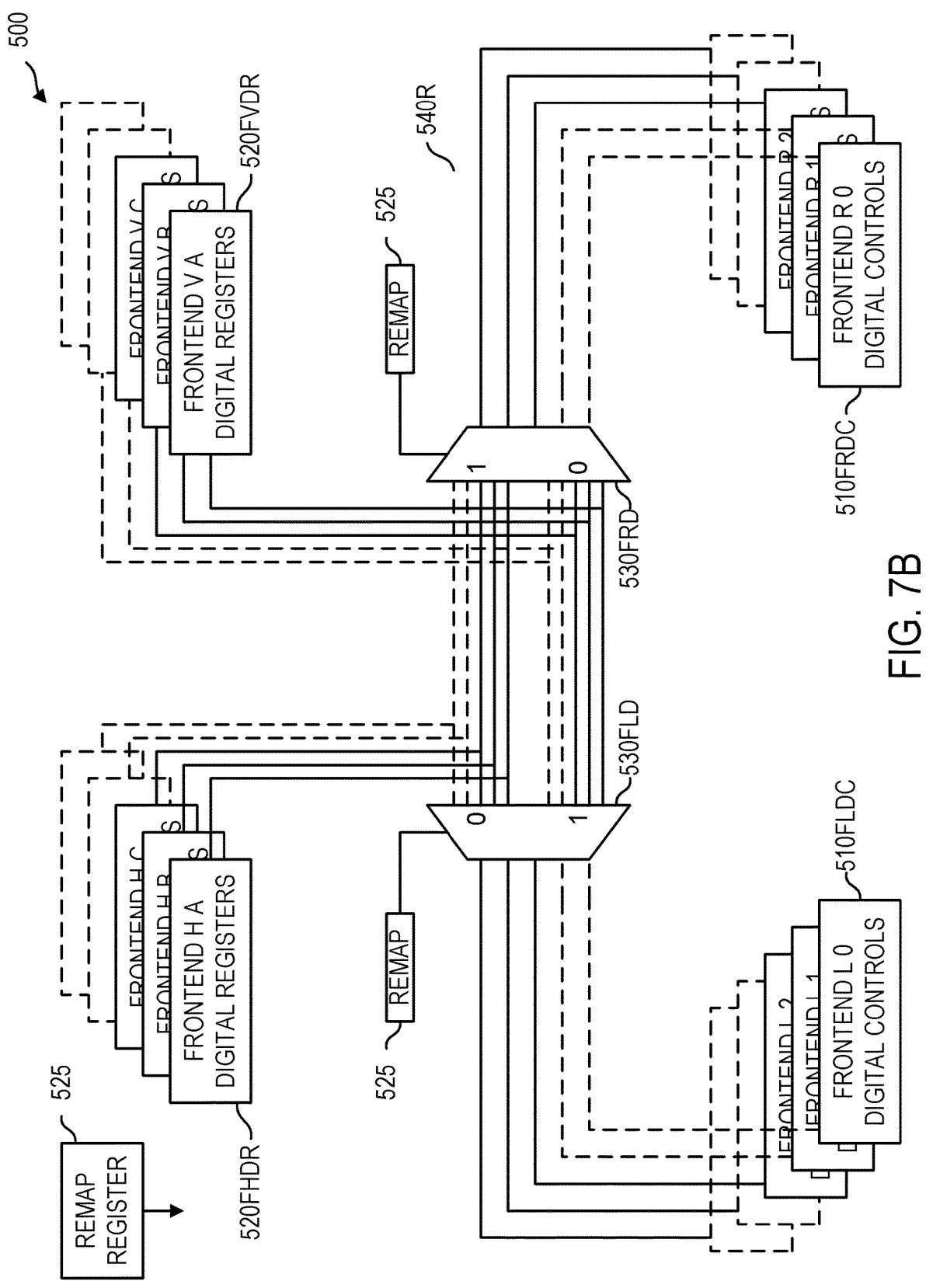

FIGS. 7A and 7B are parts of a schematic block diagram illustrating a second main embodiment—the on-chip remapping implementation of a beamformer IC.

Figure 8:
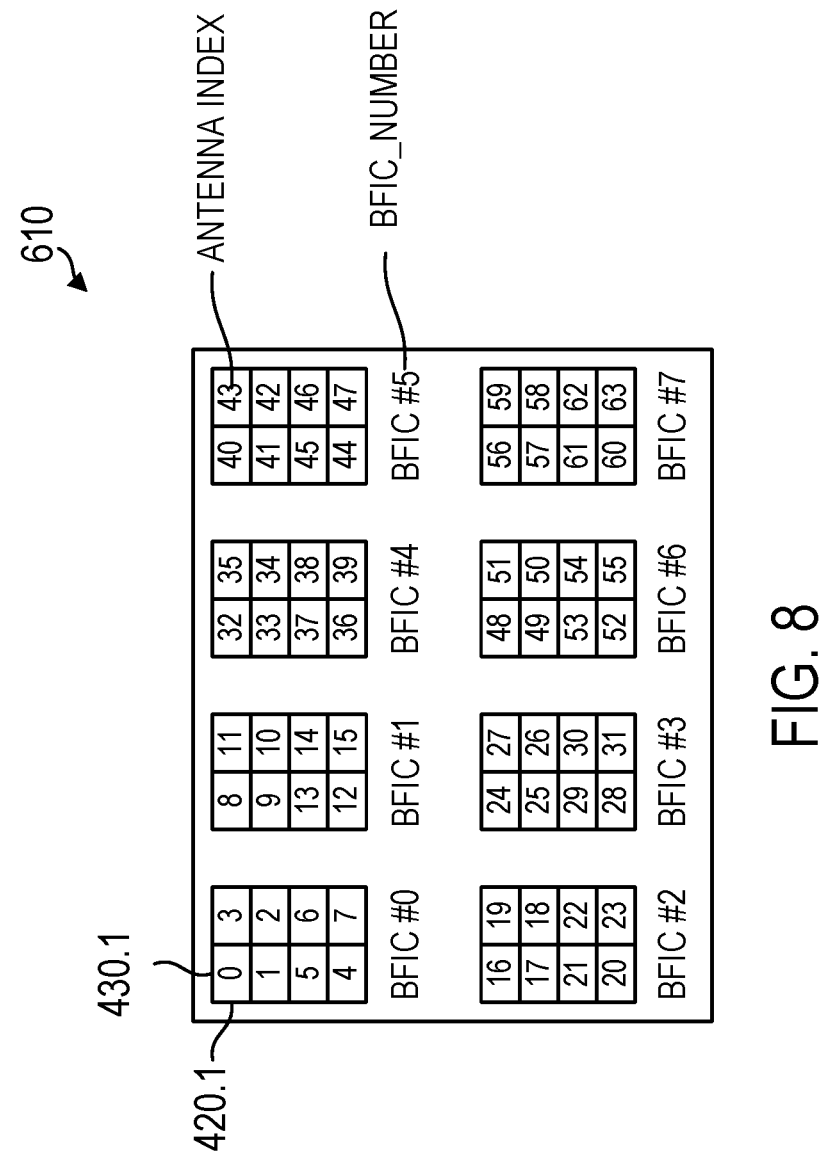

FIG. 8 is a pictorial block diagram illustrating a multi-IC array module layout of the second main embodiment.

Figures 9A, 9B:
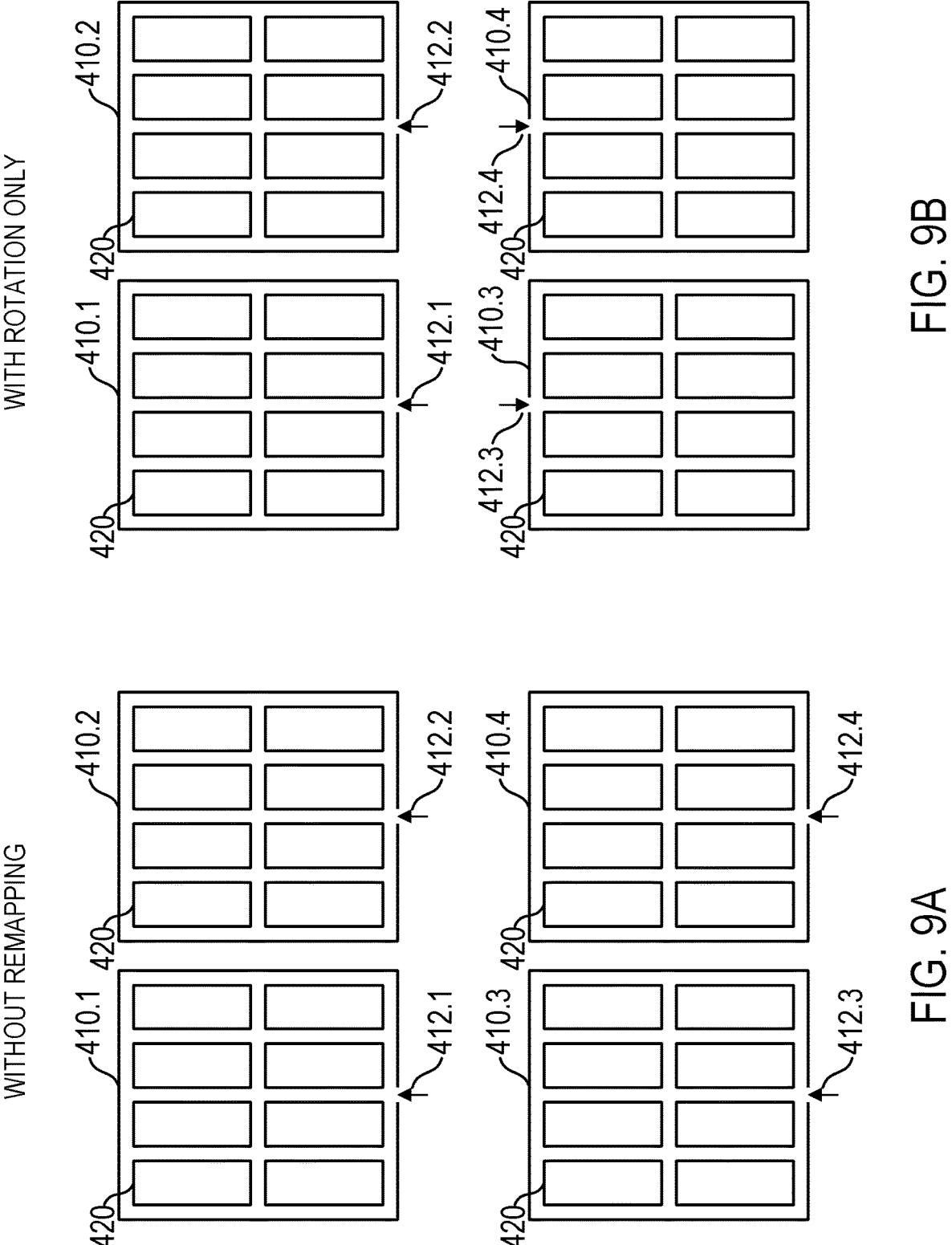

FIG. 9A is a block pictorial diagram that shows a plurality of phased array modules, each containing a plurality of ICs, according to some embodiments.

FIG. 9B is a block pictorial diagram that shows a plurality of phased array modules having the lower modules rotated, according to some embodiments.

Figure 10A:
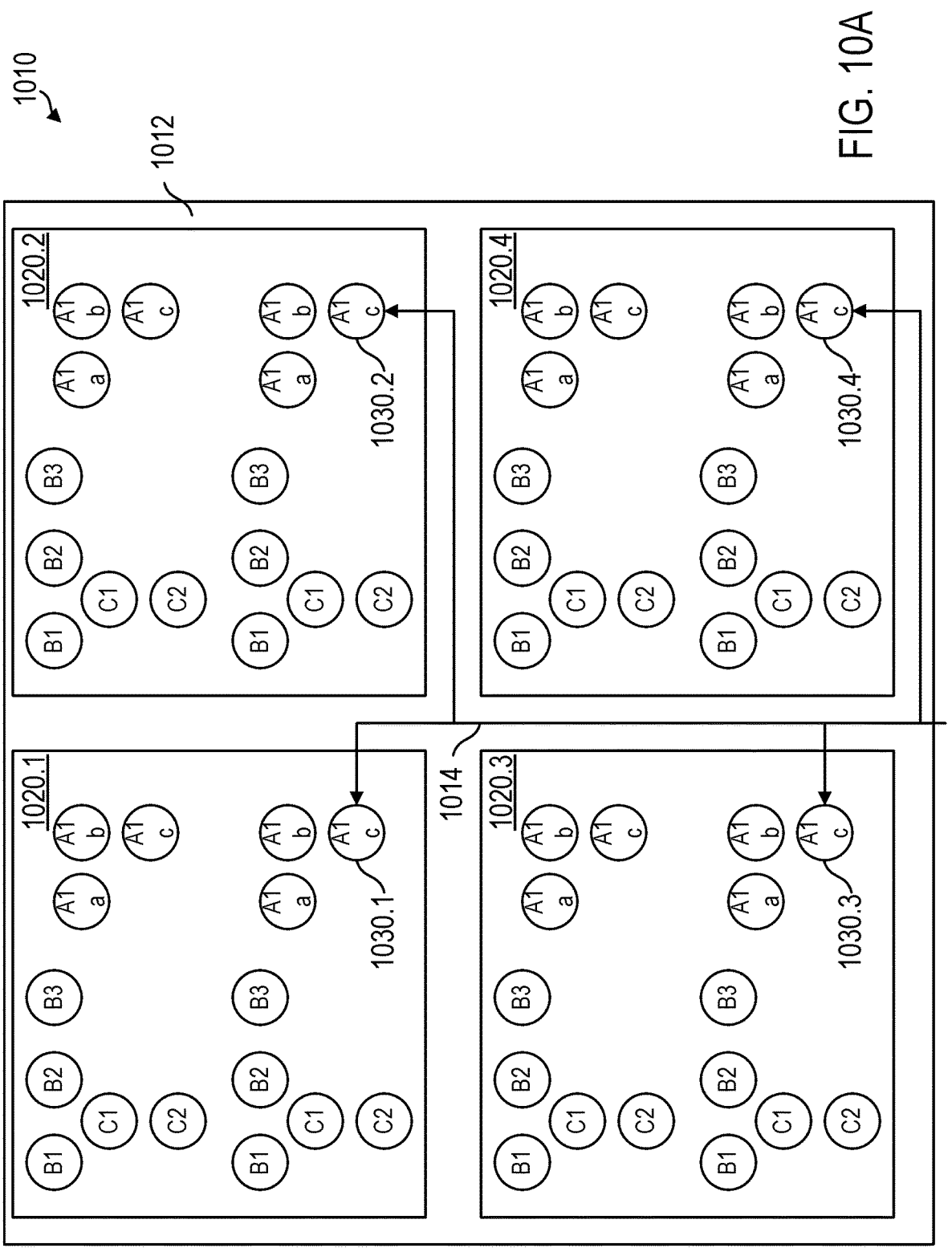

FIG. 10A is a block pictorial diagram illustrating four ICs that may be provided on an IC module on a package substrate, according to some embodiments.

Figure 10B:
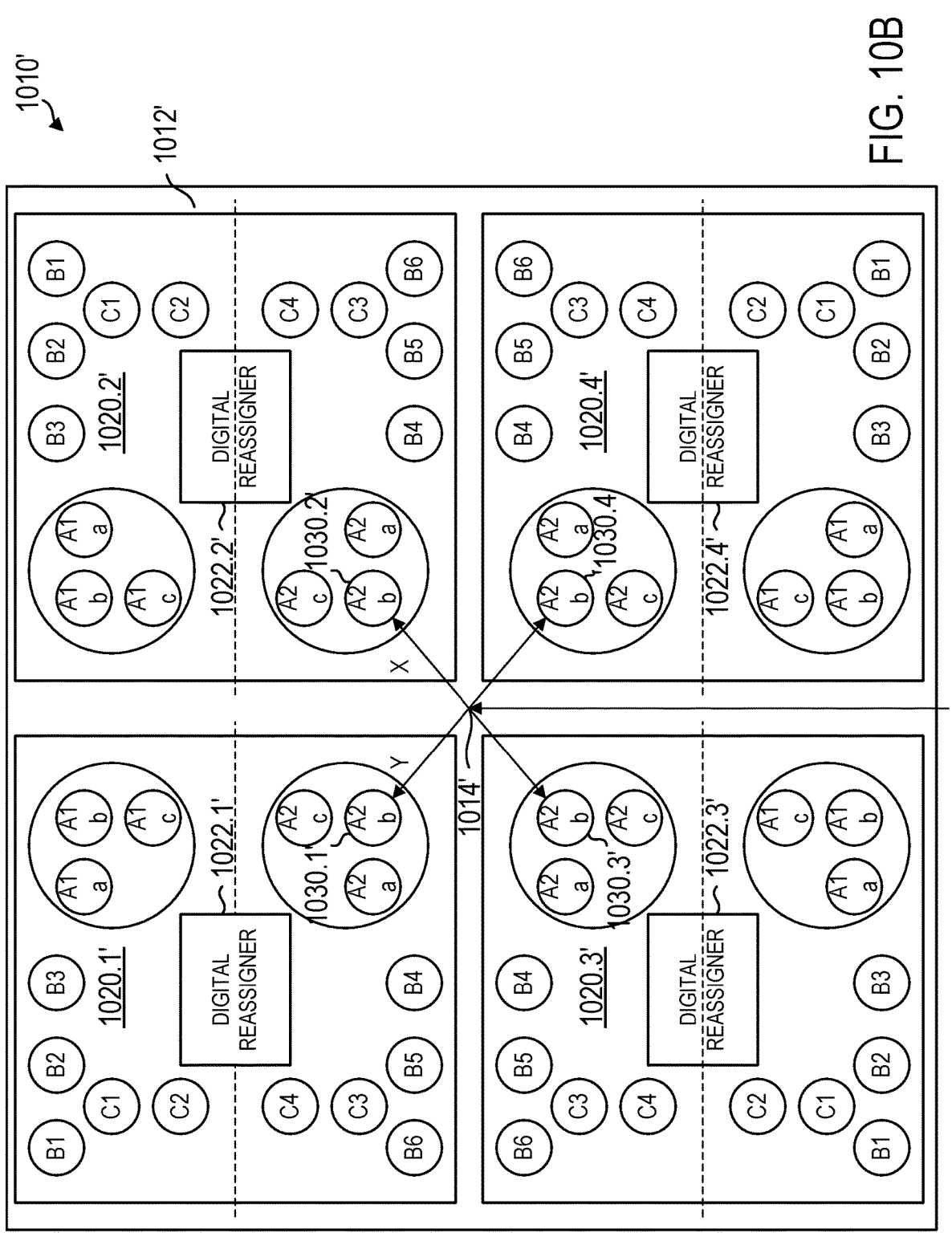

FIG. 10B is a block diagram of an example implementation using a hierarchical digital reconfiguration of ICs, in which an IC module on a package substrate comprises four ICs, according to some embodiments.

Figure 11A:
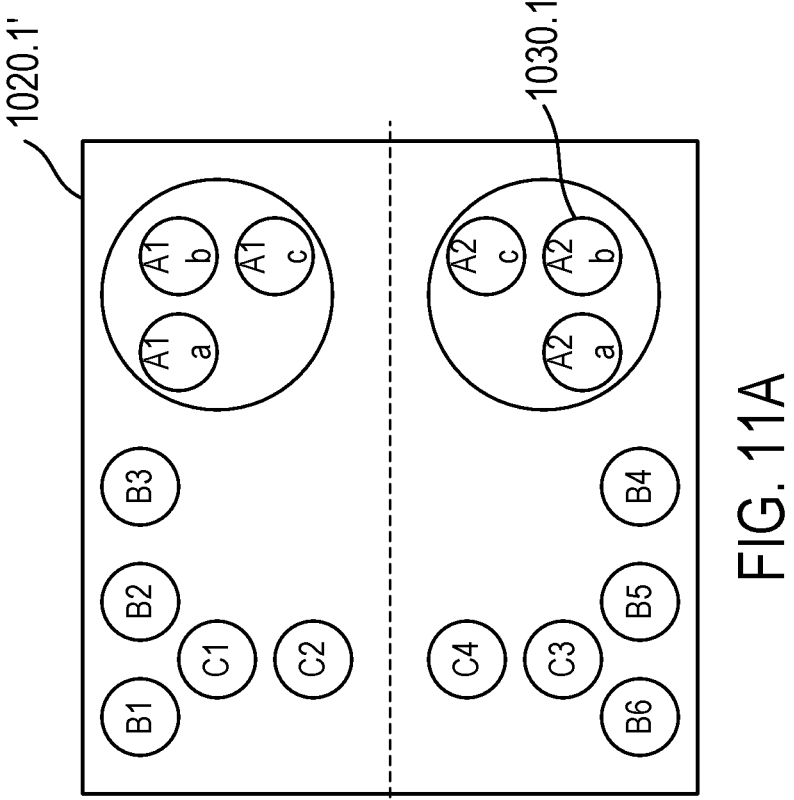

FIG. 11A is a pictorial diagram of an example IC, according to some embodiments.

Figure 11B:
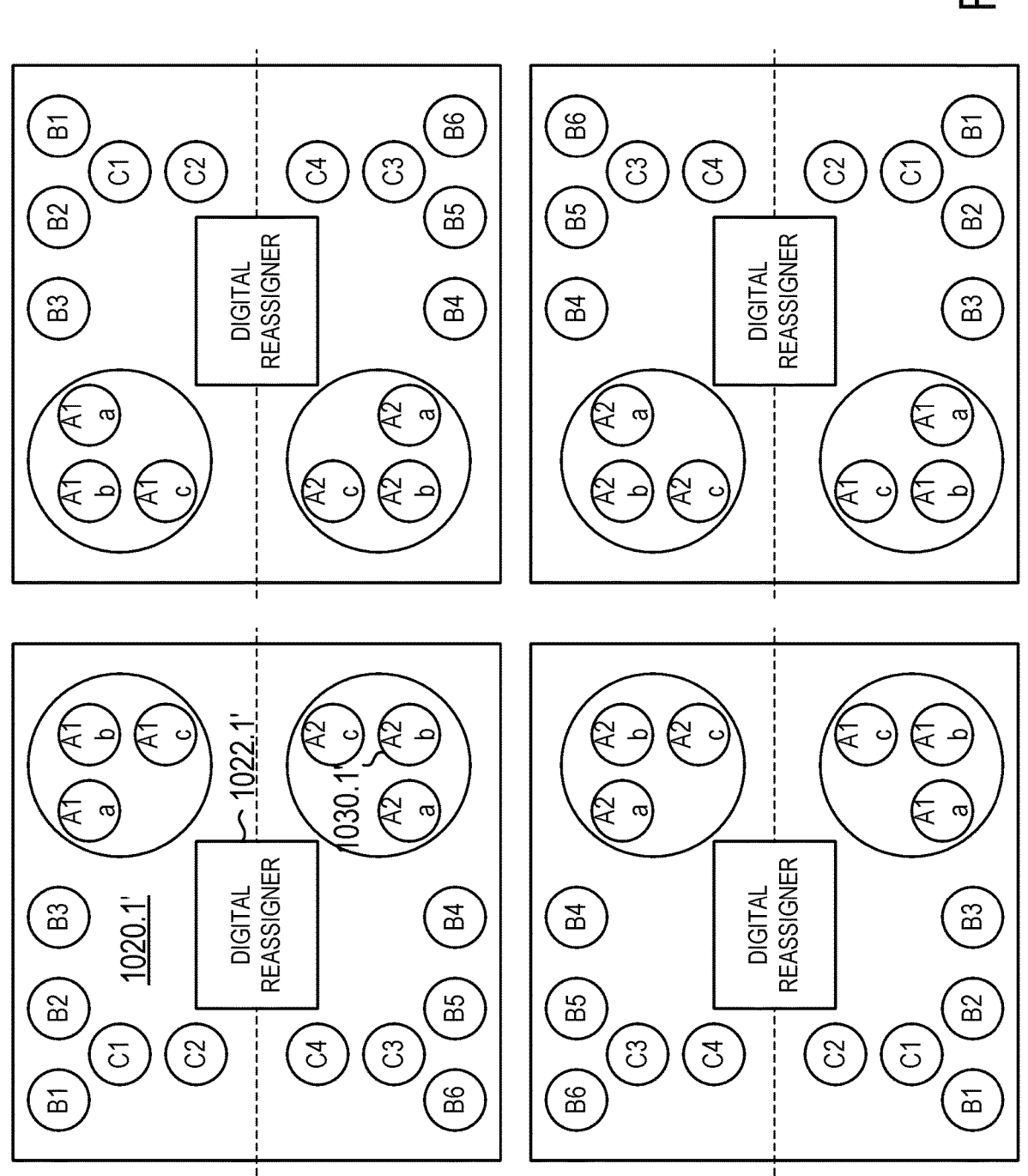

FIG. 11B is a pictorial diagram of an example module, according to some embodiments.

Figure 12:
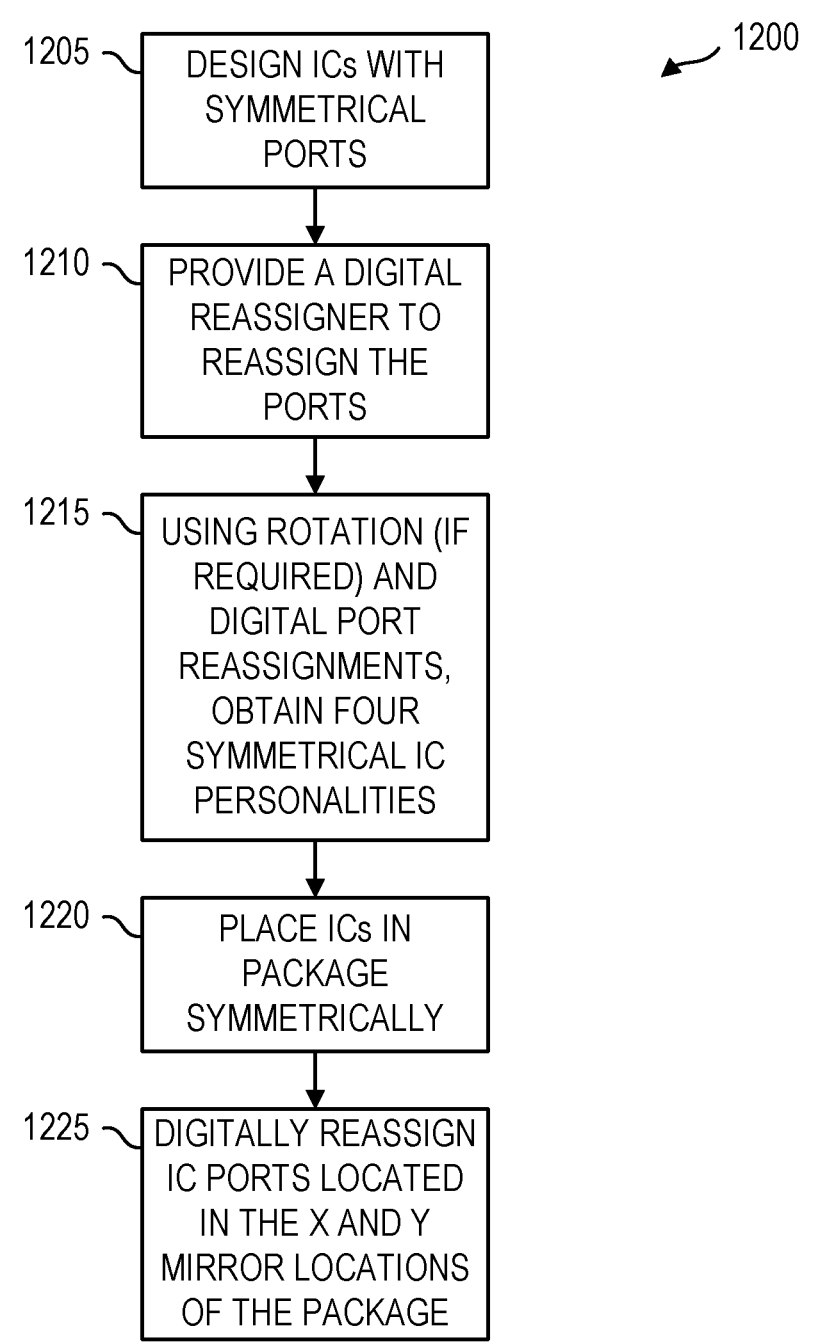

FIG. 12 is a flowchart illustrating a process to produce a symmetric module, according to some embodiments.

Figure 13:
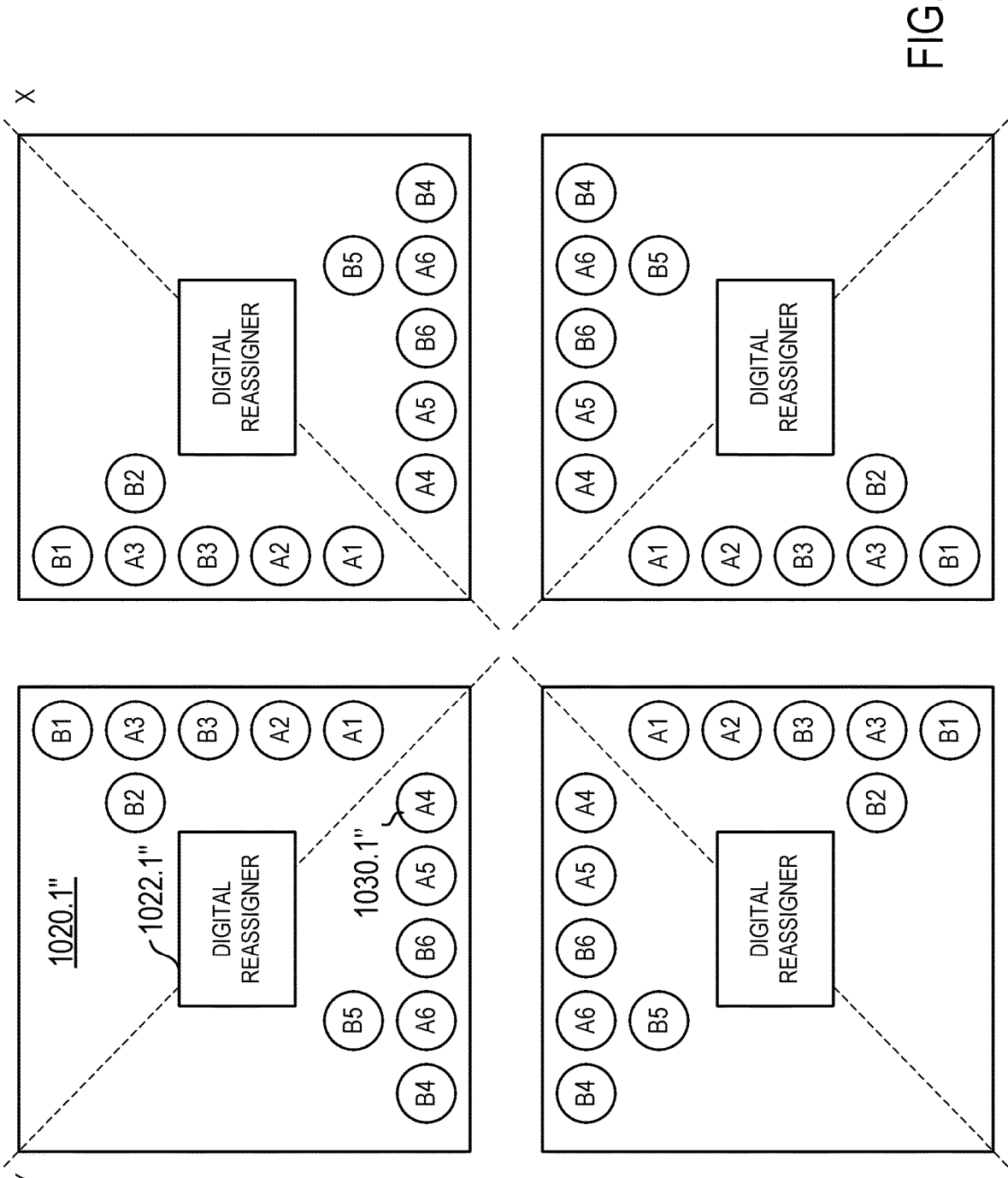

FIG. 13 is a pictorial block diagram illustrating a further embodiment of a module according to a second general example.

DETAILED DESCRIPTION

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention are presented for purposes of illustration, but are not intended to be exhaustive or limited to the embodiments disclosed. Many modifications and variations will be apparent to those of ordinary skill in the art without departing from the scope and spirit of the described embodiments. The terminology used herein has been chosen to best explain the principles of the embodiments, the practical application or technical improvement over technologies found in the marketplace, or to enable others of ordinary skill in the art to understand the embodiments disclosed herein.

Symmetric Antenna Routing in a Multi-IC Phased Array

The following application-specific acronyms may be used below:

TABLE 1

Application-Specific Acronyms

| BER | bit error rate |
| BFIC | beam forming integrated circuit |
| IC | integrated circuit, integrated circuit chip |
| IF | intermediate frequency |
| I/O | input/output |
| LO | local oscillator |
| PCB | printed circuit board |
| RF | radio frequency |
| UHF | ultra-high frequency |

Antenna design focuses on how to propagate radio frequency waves in a desired manner. One of the significant design considerations is whether to have the radio waves propagate from the antenna omnidirectionally or directionally. Omnidirectional antenna transmission may be desirable for broadcasting a signal, particularly where the targets are relatively uniformly distributed around the antenna. However, with an omnidirectional antenna, the signal will be weaker than if a lobe of a directional antenna is aimed in a particular direction. A directional antenna may be desired in circumstances where a target recipient population or entity has a directional component. Use of a directional antenna provides a signal strength gain in one or more directions at the expense of the signal strength (loss) in other directions.

Antenna gain and directionality may be achieved by antenna design. For fixed element antennas, the various constituent elements are rigidly positioned with respect to one another. In order to achieve a gain in a particular direction, the antenna is physically rotated such that a signal beam is pointed in that direction. To change the direction, the antenna must be physically rotated in order to change the direction of its beam lobes. However, physically rotating an antenna may not always be possible or practical.

In these situations, a phased array antenna may be used. The phased array antenna is an electronically scanned (computer-controlled) array of antennas which creates a beam of radio waves that can be electronically steered to point in different directions without moving the antennas. In a simple array antenna, the radio frequency current from the transmitter is fed to multiple individual antenna elements with the proper phase relationship so that the radio waves from the separate elements combine (superpose) to form beams, to increase power radiated in desired directions and suppress radiation in undesired directions.

In a phased array, the power from the transmitter is fed to the radiating elements through devices called phase shifters, controlled by a computer system, which can alter the phase or signal delay electronically, thus steering the beam of radio waves to a different direction. Since the size of an antenna array extends many wavelengths to achieve the high gain needed for narrow beamwidth, phased arrays are mainly practical at the high frequency end of the radio spectrum, in the ultra-high frequency (UHF) and microwave bands, in which the operating wavelengths are conveniently small.

The discussion below makes reference to integrated circuit chips (ICs), however, this is only an embodiment, and this reference is made for the sake of convenience only. The IC serves as a proxy herein for any circuit, which may be, e.g., a sub-portion of an IC chip. The term IC herein may be replaced with the term "circuit" and mean any form of interconnected electrical components.

Phased arrays in ICs ideally use many identical antenna elements to create beams. A beamforming IC is one that manipulates the phase and gain of the signal to and from each antenna, and may include other functions, such as splitting signals to, and combining signals from, the connected antennas. However, in reality, such antenna elements have minor variations due to different routing from each IC element to each antenna element.

FIG. 1A is a pictorial diagram illustrating an example of the antenna connections on a module 100' with asymmetric antenna routing. In this illustration, the routing is different for each antenna element. FIG. 1B is a pictorial diagram illustrating an example of an antenna with symmetric routing 100. In this configuration, each antenna routing is identical for every set of four elements. By creating symmetric routing in the X-direction and the Y-direction for the IC phased array, identical routing may be enabled for every set of elements, thus enabling more ideal beam patterns for the phased array antenna module.

Disclosed herein, according to some embodiments, is a multi-IC phased array module having X and Y symmetry, composed of ICs: a) that have only X (or Y) symmetry of analog design; and b) that have neither X nor Y symmetry of digital controls. Advantageously, various embodiments disclosed herein enable creation of a symmetric multi-IC phased array featuring dual-axis symmetry using partially symmetric ICs featuring single-axis symmetry. The symmetrical versions of an IC may be created at design time, since it is relatively easy to flip the computer representation of the IC design before the IC is produced. However, one cannot do the same thing with a physical entity that has already been produced.

The challenge of creating a symmetric phased array revolves around the fact that physical ICs can only be rotated in their package, and not flipped. A multi-channel phased array IC requires symmetry in the X (or Y) axis in order to create a multi-IC phased array module with symmetry in both the X and Y axis. A phased array module with X and Y symmetry enables creation of multi-module phased array assemblies with X and Y symmetry. The design of a multi-channel phased array IC with x-axis symmetry of analog elements is relatively straightforward—however, each channel is uniquely digitally addressed, so digital controls for the elements will not also have x-axis symmetry.

FIGS. 2A-2C are pictorial diagrams illustrating an example of a hierarchical layout for the phased array, according to some embodiments of the present disclosure. FIG. 2A is a pictorial diagram of a phased array IC 220 having an x-axis symmetry for its phased array IC elements A, C, B, and D (respectively 230.1, 230.2, 230.3, and 230.4). The x-axis symmetry illustrates that Element A 230.1 and Element B 230.3 are the same, and that Element C 230.2 and Element D 230.4 are the same. However, Element A 230.1 differs from Element C 230.2, and Element B 230.3 differs from Element D 230.4. Thus, as indicated above, there is only one axis of symmetry, but it makes no difference for the purposes herein what that axis of symmetry is, and X-axis symmetry as used herein will be used as a proxy for any other single axis of symmetry. The elements 230 of FIG. 2A may be, e.g., ports of the IC that connect to one end of the wires shown in FIG. 1B.

As described herein, elements of the ICs, e.g., ports (which may correspond to pins on the IC), connections, components, antennas, and other entities, where symmetry is relevant, may be provided in even numbers, such that an axis of symmetry may evenly divide the entities. For example, an IC having an even number of ports (or, by extension, other features) may have half of the ports lie on one side of an axis of symmetry, and the other half of the ports may lie on the other side of the axis of symmetry. However, one or more of the ports may actually lie along the axis of symmetry, and thus there does not need to be a corresponding port (or feature) for those.

FIG. 2B is a pictorial diagram of a phased array module 210. The module 210 may have one or more ICs 220 embedded in a module substrate. A module 210 may also be referred to herein as a "tile", and may be made of ICs 220 mounted to a "package" having a package substrate.

In this instance, the module 210 is comprised of four phased array ICs 220, some of which have been manufactured as remapped (which may also be referred to as "mirrored") about the X-axis (although Y-axis remapping may be used just as easily). The first phased array IC 220.1 shows a first configuration having a 0° rotation and the original digital mapping. The second phased array IC 220.2 shows a second configuration having a 0° rotation that is digitally remapped about the X-axis. The third phased array IC 220.3 shows a third configuration having a 180° rotation with the original digital mapping. The fourth phased array IC 220.4 shows a fourth configuration having a 180° rotation that is digitally remapped about the X-axis.

FIG. 2C is a pictorial diagram of a phased array assembly 200 that is comprised of four phased array modules 210.1, 210.2, 210.3, and 210.4. An example of such an assembly 200 might be a printed circuit board (PCB) upon which the modules 210 may be mounted. Although FIG. 2C shows all of the modules 220 that are mounted (or "tiled") on the assembly 200 being identical, the same principles of mirroring and rotation may be applied at this level as well. Furthermore, the significance of FIGS. 2A-2C is to show a hierarchy and the principles discussed herein being applied at different levels of the hierarchy. But the hierarchy is not limited to IC (chip)→module (package, tile)→assembly (PCB)—it may extend into sub-chip circuitry elements or in an opposite direction to groupings of assemblies. The use of IC, module, and assembly herein is by way of example only.

FIG. 3 is a flowchart of an example process 300 that may be used to create the phased array assembly 200, according to some embodiments of the present disclosure. In operation 305, a phased array IC 220 design is created in both a normal layout and a remapped (mirrored) layout having a one-axis (X or Y) symmetry of its analog elements 230. In operation 310, a default configuration is created. This default configuration may, for example, correspond to the IC in the first configuration IC 220.1. In operation 315, a digital remapping scheme is created to configure the IC addresses enabling a mirror configuration on the axis of symmetry. For example, this may correspond to the second configuration IC 220.2. In operation 320, the second configuration IC 220.2 is rotated 180° to create the third configuration IC 220.3 that is mirrored along the axis of symmetry. In operation 325, the first configuration is rotated 180° to create the fourth configuration IC 220.4 that is mirrored on the X-axis and the Y-axis. In operation 330, the first 220.1, second 220.2, third 220.3, and fourth 220.4 configuration ICs are placed on a module to create the symmetric phased array module 210 (FIG. 2B). This process may be repeated a number of times, and these symmetric phased array modules 210.1 through 210.4 may be, in operation 335, placed horizontally and vertically to create a symmetric scaled phased array assembly 200, as illustrated by way of example in FIG. 2C.

FIG. 4 is a pictorial diagram illustrating an example generalized embodiment of a multi-IC module 410, according to some embodiments of the present disclosure. The multi-IC module 410 is comprised of four ICs, 420.1-4. Each of the ICs 420 may be comprised of multiple elements 430 (only one provided with a reference no. for the sake of simplicity) that may be horizontal (H) and vertical (V), as well as respective amplifier and bias circuitry for the respective horizontal and vertical elements 430, the ICs 420 may further comprise digital logic that is used to control, e.g., mapping of ports and the like.

The first IC 420.1 shows the physical layout with the original mapping. The second IC 420.2 shows the physical layout that has been rotated 180° from the original mapping and remapped/mirrored about the y-axis. The third IC 420.3 shows the physical layout that has been rotated 180° from the original mapping. Finally, the fourth IC 420.4 shows the physical layout that has been remapped/mirrored about the x-axis.

FIGS. 5A and 5B are parts of a schematic block diagram illustrating a generalized embodiment—the on-chip remapping implementation of a beamformer IC. The remapping utilizes (FIG. 5A) a set of common analog 510LAC, 510RAC and digital 510LDC, 510RDC controls, and a set of common analog 520HAR, 520VAR and digital 520HDR, 520VDR registers.

The common controls 510 are the destination for digital signals used to manipulate the analog and digital circuitry. Examples of analog controls 510LAC, 510RAC are signals to, e.g., adjust bias currents or to turn on or off analog switches. Examples of digital controls 510LDC, 510RDC are signals which affect calculations. The common registers 520 are the source of digital signals used to manipulate analog or digital circuitry. These are manipulated by the computer over a digital communication port on the IC 220. The remap register 525 provides a digitally controlled signal to indicate whether the ports should use the original mapping or be remapped.

The multiplexers (MUXes) 530 route the signals from the registers to the appropriate controls depending on whether the IC 220 is configured to use the original mapping or to be remapped. In the original mapping (remap=0), Common H Registers are connected to Common L Controls, and Common V Registers are connected to Common R Controls. When remapped (Remap=1) Common H Registers are connected to Common R Controls and Common V Registers are connected to Common L Controls.

FIG. 5B illustrates the frontend digital controls 510FLDC, 510FRDC and the frontend digital registers 520FHDR, 520FVDR along with the channel remap circuitry 540L, 540R and remap register 525. For symmetry, the registers control the desired controls depending on whether the IC 220 is configured to use the original mapping or to be remapped. In the original mapping, Registers A, B, C, . . . are connected to Controls 0, 1, 2, . . . . When remapped, the order of the connections are reversed, so Registers A, B, C, . . . are connected to controls . . . , 2, 1, 0.

FIG. 6 is a pictorial block layout diagram of an example second main embodiment of a multi-IC module 610. This module 610 may comprise original mapping ICs 420.1 (see also FIG. 4) and remapped ICs 420.5, in which the H and V elements are semi-mirrored on the y-axis. The register numbers themselves, however, are not mirrored, and the channel numbers are remapped in software by the computer that is controlling the phased array (see also FIG. 8). Although FIG. 6 shows four ICs in a module, a module may comprise, e.g., eight or some other number of ICs.

FIGS. 7A and 7B are parts of a schematic block diagram illustrating a second main embodiment—the on-chip remapping implementation of a beamformer IC 700, which has some similarities with the embodiment shown in FIGS. 5A and 5B. In this embodiment, a dual polarized phased array IC 700 is created with two sets of the following elements— one set on the left side, and one identical set on the right side of the IC. There are n digital front end control blocks (left and right) 510FLDC, 510FRDC that interface with corresponding n RF front ends. Analog amplifiers and infrastructure blocks common to all n front ends may be provided and may be manipulated by the analog controls. For example, an analog control may be used to power down an analog amplifier or change its gain. Additionally, a central digital control common to all n front ends 510LDC, 510RDC may be provided. An example of a central digital control may be a global powerdown signal, or something similar.

The following functions are multiplexed using a digital multiplexer 530LA, 530RA, 530LD, 530RD, 530FLD, 530FRD to allow routing of control settings pertaining to H or V polarization to either the left or right side of the IC: 1) bias, power, and common analog amplifier controls 510LAC, 510RAC; 2) "select" signals to enable communication to a subset of the n RF front ends; 3) global parameters for use by the central digital control 510LDC, 510RDC; and 4) phase and gain control within each RF front end. The channel remapper 540 is omitted in FIG. 7B since, as noted above, the channel numbers are remapped in software by the computer that is controlling the phased array.

FIG. 8 is a pictorial block diagram illustrating a multi-IC array module 610 layout of the second main embodiment. An array of eight ICs 420.1 are arranged across the module, each having an associated beam-forming IC (BFIC) number, with the ICs 420.1 being comprised of a number of elements 430.1. This module 610 layout shows the lack of symmetry in the module due to the lack of the channel remap component since the channel remapping is done in software by the control computer.

FIGS. 9A and 9B are block pictorial diagrams that illustrate a practical advantage to remapping when assembling multi-module phased arrays. FIG. 9A shows a plurality of phased array modules 410.1 through 410.4, each containing a plurality of ICs 420. In each array module 410, an I/O port 412.1 through 412.4, respectively, is located on a south edge of the module. However, in some instances, it is preferred to have the I/O ports 412 located towards the center of the array (I/O adjacency). FIG. 9B shows a plurality of phased array modules 410.1 through 410.4 having the lower modules 410.3, 410.4 rotated. As a result, the lower modules' I/O ports 412.3, 412.4 are now located on the north edge of these modules, with the antenna routing symmetry preserved (presuming the underlying modules are symmetric in terms of the antennas). Additionally, remapping is applied to the ICs 420 and FE numbering in order to mask the effect of the rotation.

Symmetric Multi-IC Modules Using Hierarchical Digital Reconfiguration of ICs

The principles discussed above may be generalized to extend beyond an antenna application and may apply to any design of a symmetric multi-IC module using a hierarchical digital reconfiguration of the ICs about any axis of symmetry.

A process is provided for creating a symmetric multi-IC modules using hierarchical digital reconfiguration of ICs. In a first operation, an IC is designed that has at least one axis of symmetry in the location of each type of its ports (C4 bumps, for example). Multiple types of ports can be created (e.g., antenna-type ports, digital data-type ports)—the set of ports of one type need to be symmetric along the at least one axis of symmetry. For each type of port, any port can be digitally reassigned to any other port of that type.

The process digitally reassigns the ports to create x, y, and diagonal mirror versions of the IC, creating ICs with mirror personalities. If the ports have only one axis of symmetry, then rotations may be required. ICs are placed in the package in symmetrical locations with appropriate mirror personalities enabling symmetrical interconnect routing in the package.

The task of a digital reassigner is to enable the ports on a given axis of symmetry to operate as if the ports are on the opposite side of the axis. The digital reassigner may achieve this through the use of multiplexers, through logic gates that effectively achieves the symmetry. The digital reassigner may also do reconfiguration of analog circuits that lead to the symmetric operation, for example through use of switches, phase shifters, delay circuits, amplifiers. The digital reassignment function may also be split across different levels of the hierarchy such that the overall reassignment across the levels of hierarchy is achieved. For example, the task of digital reassignment for swapping IF ports may be pushed to another portion of the hierarchy (for example using an RF phase shifter) such that the overall functionality is as if the IF ports were swapped.

FIG. 10A is a block pictorial diagram illustrating four ICs 1020.1 through 1020.4 that may be provided on an IC module 1010 on a package substrate 1012, according to some embodiments of the present disclosure. Each IC 1020 has a plurality of different types of ports—for example, shown in FIG. 10A is a first type of port beginning with the reference character Ax, a second type of port beginning with the reference character Bx, and a third type of port beginning with the reference character Cx, where each x is an integer. As shown, there are multiple instances for each type of port x=1, x=2, x=3. The ICs 1020 are identical, and they each have a common I/O access point at ports 1030.1 through 1030.4, respectively, at which a common I/O signal via a signal line 1014 is provided. The ports 1030 may be, e.g., antenna-type ports, digital data-type ports, etc.

FIG. 10B is a block diagram of an example implementation using a hierarchical digital reconfiguration of ICs, in which an IC module 1010' on a package substrate 1012' comprises four ICs 1020.1' through 1020.4'. The port features are similar to those described with respect to FIG. 10A. However, each of the ICs 1020' further comprises a digital reassigner 1022', which is used to reassign the ports 1030' of the ICs 1020'. For each type of port, any port can be digitally reassigned to any other port of that type. In this embodiment, symmetry is created along the diagonal to create x, y diagonal axis mirror versions of the ICs, which are the mirror "personalities". If the ports 1030' have only one axis of symmetry, rotations might be required. In this example embodiment, the ICs 1020' are placed in the package/ module 1010' in symmetrical locations based on the mirror personalities, thereby enabling a symmetrical interconnect routing from, e.g., a common point via a signal line 1014'.

According to a hierarchical extension embodiment, the technique described above may be extended hierarchically such that each port 1030 is replaced by a group of ports. As shown in FIG. 10B, the ports A1 and A2 are replaced with the respective groups of ports {A1*a*, A1*b*, A1*c*}, {A2*a*, A2*b*, A2*c*}, respectively. Within each group of ports, each individual port can be digitally reassigned to another symmetric port using the digital reassigner 1022. Further levels of hierarchy may be added and digitally reassigned and may be performed internally at each level of the hierarchy to maintain overall port symmetry within in the IC 1020. The group of ports considered for symmetry at each level of the hierarchy do not have to be the same. By way of example, radio frequency (RF) ports, intermediate frequency (IF) ports, local oscillator (LO) ports, and digital-data ports may be the focus at different levels of the hierarchy.

Referring back to FIG. 8, symmetry in the second main 256-element module may have symmetry enabled using rotations and assignments at three levels of hierarchy: at a module level, symmetry may be enabled by rotating and reassigning ICs in each component 64-element module. At the module level of the hierarchy, the symmetry may be enabled by reassigning the H and V polarization group of ports in each IC. Finally, at the IC level, the symmetry may be enabled by reassigning the port (e.g., antenna port) number within the H/V port group.

As described thus far, the axis of symmetry has been considered as a single axis of symmetry, however, various embodiments of the invention are not so limited. It may be possible that multiple axes of symmetry exist. For example, in FIG. 10B, the reassignment within a port group A1 or A2 may be performed across a separate axis of symmetry than the axis of symmetry for the other ports—thus, there may be, e.g., a first axis of symmetry, and a second axis of symmetry.

FIGS. 11A and 11B are pictorial diagrams illustrating various stages of production of the general example module 1010' illustrated in FIG. 10B. FIG. 12 is an example process 1200, according to an embodiment, for producing the various stages and is discussed with reference to FIGS. 11A and 11B. In a first operation 1205, and referring to FIG. 11A, an IC 1020.1' is designed to have at least one axis of symmetry and a general function of symmetrical ports. Multiple types of ports may be created, and the set of ports of one type need to be symmetric along the axis of symmetry. Any port can be digitally reassigned to any other port of a given type.

By way of example, ports B1-B6 and C1-C6 are symmetrical unit ports, and A1 and A2 are symmetrical groups of ports. In operation 1210, and referring to FIG. 11B, a digital reassigner 1022.1' is provided to reassign ports 1030. By way of example shown in FIG. 11B, the digital reassigner 1022.1' may reassign: 1) any B-type port to any other B-type port; 2) any C-type port to any other C-type port; 3) any A-type port group to any other A-type port group; and 4) any A-type port to any A-type port within a same port group. A port group is a group of ports that work together. Group A1 can all be remapped to Group A2. Within each group, the sub-ports can also be remapped among each other. For example sub-port A1*a* can be remapped to sub-port A1*c*. However, partial remapping of the sub-ports is not allowed between the port groups. For example, digital buses could be remapped among each other and within each other, but not partially. Similarly, differential ports P/N could be remapped to N/P. So here, the N+P ports would constitute a group.

In operation 1215, using the digital port reassignments and rotation (if required), four symmetric IC 1020 personalities are provided. In operation 1220, these ICs 1020 are placed in a module symmetrically to ensure symmetrical module routing. The ICs 1020 are placed in the module in symmetrical locations such that all ports are symmetrical after digital reassignment. Symmetrical routing is created to each IC 1020 in the module to create a symmetrical module. In operation 1225, a digital reassignment of the ports of the ICs located in the x and y mirror locations of the module is performed to create the corresponding x and y mirror versions of the original IC—these versions are mirror personalities with identical hardware as that of the original IC. If the IC ports have only x or y symmetry, rotations might be required.

FIG. 13 is a pictorial block diagram illustrating a further embodiment of a module 1020.1" according to a second general example that may be created using, e.g., the example process 1200 described above. In this example, A1-A6 and B1-B6 are symmetrical unit ports 1030.1". This embodiment illustrates diagonal symmetry. The digital reassigner 1022.1" may reassign: 1) any A-type port to any other A-type port; and 2) any B-type port to any other B-type port. Using the port reassignments, four symmetrical IC personalities can be obtained. This technique may be extended to any axis of symmetry.

TECHNICAL APPLICATION

The one or more embodiments disclosed herein accordingly provide an improvement to integrated circuit technology. For example, symmetrically-packaged IC designs may be valuable to many analog/RF/mixed-signal applications, especially for communication circuits. In a first example application, phased array systems rely on matching to create spatial nulls. Antennas that see similar environments are symmetrical and cancel each other in the direction of a spatial null. Asymmetry causes a mismatch, reducing the null depth. For example, circuit noise limits nulls to 70-90 dB. However, a 30 dB antenna matching would limit the null depth to −30 dB, reducing the spatial nulling capabilities by 40 to 60 dB, or 10,000× to 1,000,000×. Providing the design symmetry described herein may reduce or effectively eliminate the negative effects due to asymmetry in analog/RF/ mixed-signal applications.

In a second application example, clock and data skew among ICs presents a challenge in multi-IC wireline and optical communication modules. Module level asymmetry may cause clock and data skews which can cause severe bit error rate (BER) degradation, and therefore reduce achievable data rates for a given BER. Providing the design symmetry described herein may reduce or effectively eliminate the negative effects of BER degradation.

What is claimed is:
1. A circuit, comprising:
  a first set of ports of a first type arranged symmetrically about a first axis of symmetry;

a second set of ports of a second type arranged symmetrically about a second axis of symmetry; and a digital reassigner configured to reassign an original port of the first set of ports to a reassigned port of the first set of ports located on an opposite side of the first axis of symmetry and to reassign an original port of the second set of ports to a reassigned port of the second set of ports located on an opposite side of the second axis of symmetry, wherein:

the first type of port is selected from the group consisting of an antenna-type port, a radio frequency port, an intermediate frequency port, a local oscillator port, and a digital data-type port; and the second type of port is selected from the group consisting of an antenna-type port, a radio frequency port, an intermediate frequency port, a local oscillator port, and a digital data-type port, and wherein the second type of port differs from the first type of port.

2. The circuit of claim 1, wherein the first axis of symmetry and the second axis of symmetry are both one of a vertical, a horizontal axis of symmetry, and a diagonal axis of symmetry with respect to the circuit.

3. The circuit of claim 1, wherein the first axis of symmetry and the second axis of symmetry are the same axis.

4. The circuit of claim 1, wherein the circuit is an integrated circuit chip having a common chip substrate.

5. A circuit module, comprising a plurality of the circuits of claim 1.

6. The circuit module of claim 5, wherein:

a first modified proper subset of the plurality of the circuits are modified circuits that have digitally reassigned ports such that the modified circuits are mirrored personalities of an unmodified subset of the plurality of the circuits.

7. The circuit module of claim 5, wherein:

a second modified proper subset of the plurality of the circuits are rotated with respect to other circuits of the plurality of circuits.

8. The circuit module of claim 7, wherein:

a first modified proper subset of the plurality of the circuits are modified circuits that have digitally reassigned ports such that the modified circuits are mirrored personalities of an unmodified subset of the plurality of the circuits.

9. The circuit module of claim 5, wherein connections to the first set of circuit ports are symmetrical in a package in at least one axis of symmetry.

10. The circuit module of claim 5, wherein the circuit module is a package comprising a package substrate upon which the plurality of circuits is mounted.

11. A method for producing a circuit, comprising:

providing a plurality of ports of a first type arranged about a first axis of symmetry of the circuit;

providing a second set of ports of a second type arranged symmetrically about a second axis of symmetry; and providing a digital reassigner configured to reassign an original port of the set of ports to a reassigned port of the set of ports located on an opposite side of the first axis of symmetry and to reassign an original port of the second set of ports to a reassigned port of the second set of ports located on an opposite side of the second axis of symmetry, wherein:

the first type of port is selected from the group consisting of an antenna-type port, a radio frequency port, an intermediate frequency port, a local oscillator port, and a digital data-type port; and the second type of port is selected from the group consisting of an antenna-type port, a radio frequency port, an intermediate frequency port, a local oscillator port, and a digital data-type port, and wherein the second type of port differs from the first type of port.

12. The method of claim 11, wherein the first circuit defines a default configuration, the method further comprising:

producing a second circuit that is the same as the first circuit, but having a mirrored configuration with respect to the first circuit; and applying the first circuit and the second circuit on a common substrate.

13. The method of claim 11, wherein the first circuit defines a default configuration, the method further comprising:

producing a second circuit that is the same as the first circuit;

rotating the second circuit 180° to produce a rotated circuit; and applying the first circuit and the rotated circuit on a common substrate.

14. The method of claim 13, wherein the second circuit has a mirrored configuration to the first circuit.

15. The method of claim 11, further comprising placing the circuit on a package substrate to produce a circuit package.

16. The method of claim 15, further comprising producing a plurality of circuit packages to place on a common assembly.

17. A circuit module comprising:

a plurality of circuits, each circuit comprising:

a first set of ports of a first type arranged symmetrically about a first axis of symmetry; and a digital reassigner configured to reassign an original port of the first set of ports to a reassigned port of the first set of ports located on an opposite side of the first axis of symmetry, wherein a second modified proper subset of the plurality of the circuits are rotated with respect to other circuits of the plurality of circuits.

18. The circuit module of claim 17, wherein:

a first modified proper subset of the plurality of the circuits are modified circuits that have digitally reassigned ports such that the modified circuits are mirrored personalities of an unmodified subset of the plurality of the circuits.

19. The circuit module of claim 17, wherein connections to the first set of circuit ports are symmetrical in a package in at least one axis of symmetry.

20. The circuit module of claim 17, wherein the circuit module is a package comprising a package substrate upon which the plurality of circuits is mounted.

* * * * *